US012113061B2

(12) United States Patent
Palacios et al.

(10) Patent No.: US 12,113,061 B2
(45) Date of Patent: Oct. 8, 2024

(54) SEMICONDUCTOR DEVICE WITH LINEAR CAPACITANCE

(71) Applicant: Massachusetts Institute of Technology, Cambridge, MA (US)

(72) Inventors: Tomas Palacios, Belmont, MA (US); Nadim Chowdhury, Cambridge, MA (US); Qingyun Xie, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 319 days.

(21) Appl. No.: 17/225,531

(22) Filed: Apr. 8, 2021

(65) Prior Publication Data

US 2021/0343703 A1 Nov. 4, 2021

Related U.S. Application Data

(60) Provisional application No. 63/019,588, filed on May 4, 2020.

(51) Int. Cl.
*H01L 27/06* (2006.01)
*H01L 29/20* (2006.01)
(Continued)

(52) U.S. Cl.
CPC ...... *H01L 27/0605* (2013.01); *H01L 29/2003* (2013.01); *H01L 29/205* (2013.01); *H01L 29/7786* (2013.01)

(58) Field of Classification Search
CPC ............. H01L 27/0605; H01L 29/2003; H01L 29/205; H01L 21/8252; H01L 27/0629;
(Continued)

(56) References Cited

U.S. PATENT DOCUMENTS

2015/0041820 A1* 2/2015 Renaud ............. H01L 29/66462
438/172
2017/0018639 A1* 1/2017 Teo ........................ H01L 29/205
(Continued)

OTHER PUBLICATIONS

D. Mahajan and S. Khandelwal, "Impact of p-GaN layer Doping on Switching Performance of Enhancement Mode GaN Devices," 2018 IEEE 19th Workshop on Control and Modeling for Power Electronics (COMPEL), Padua, Italy, 2018, pp. 1-4, doi: 10.1109/COMPEL.2018.8460098. (Year: 2018).*
(Continued)

*Primary Examiner* — Cuong B Nguyen
(74) *Attorney, Agent, or Firm* — DALY, CROWLEY, MOFFORD & DURKEE, LLP

(57) ABSTRACT

A semiconductor device having relatively linear and constant parasitic capacitance of an operation range includes a first component having a negatively charged carrier channel and a second component comprising a positively charged carrier channel. The first component has source terminal and a drain terminal. The second component has bias terminal. Both components share a gate terminal that is electrostatically coupled to the negatively charged carrier channel of the first component and the positively charged carrier channel of the second component to produce a capacitance profile that stays relatively linear and constant as a voltage at the gate terminal changes.

19 Claims, 8 Drawing Sheets

(51) Int. Cl.
*H01L 29/205* (2006.01)
*H01L 29/778* (2006.01)
(58) Field of Classification Search
CPC ............... H01L 29/94; H01L 29/42316; H01L 29/66431; H01L 29/66462; H01L 29/778–7789; H01L 2924/13064; H01L 29/122–127; H01L 29/15–158
See application file for complete search history.

(56) References Cited

U.S. PATENT DOCUMENTS

2017/0243866 A1* 8/2017 Then ................... H01L 29/2003
2020/0328296 A1* 10/2020 Hwang ................. H01L 29/207

OTHER PUBLICATIONS

C. Claeys and C. Simoen, "Germanium-Based Technologies From Materials to Devices", 2007, Elsevier Science, 978-0-08-044953-1, 233-265 (Year: 2007).*

A. Douara, N. Kermas, B. Djellouli "Capacitance Models of AlGaN/GaN high electron Mobility Transistors", 2016, World Academy of Science, vol. 10, No. 3, pp. 420-423 (Year: 2016).*

Kexiong Zhang, Masatomo Sumiya, Meiyong Liao, Yasuo Koide & Liwen Sang, "P-Channel InGaN/GaN heterostructure metal-oxide semiconductor field effect transistor based on polarization induced", Science report, Mar. 2016, pp. 1-7 (Year: 2016).*

Teo et al., Recent Development in 2D and 3D GaN devices for RF and Power Electronics Applications, Mitsubishi Electric Research Laboratories, Dec. 16, 2020, 5 pages.

Cree, Inc., CGH27015, 15W, 28V, GaN HEMT for Linear Communications ranging from VHF to 3 GHz, May 2015, pp. 1-12, 12 pages.

Chowdhury et al., First Demonstration of a Self-Aligned GaN P-FET, Microsystems Technology Laboratories, Massachusetts Institute of Technology, Dec. 2019, 5 pages.

Kang et al., Linearity analysis of CMOS for RF application, IEEE Transaction of Microwave, vol. 51, Issue 3, Mar. 2003, 3 pages.

Chowdhury et al., p-Channel GaN Transistor based on p-GaN/AlGaN/GaN on Si, IEEE Electronic Device Letters, May 14, 2019, 5 pages.

Chowdhury, et al., Regrowth-Free GaN-Based Complementary Logic on a Si Substrate, IEEE Electronic Device Letters, vol. 41, Issue 6, Jun. 6, 2020, 3 pages.

Zhan et al., Low-Power and High-Linearity Mixer Design Using Complex Transconductance Equivalent Circuit, IEEE 2005, Custom Integrated Circuits Conference, Oct. 2005, pp. 365-368, 5 pages.

Wang et al., A Capacitance-Compensation Technique for Improved Linearity in CMOS Class-AB Power Amplifiers, IEEE Journal of Solid-State Circuits, vol. 39, No. 11, Nov. 2004, pp. 1927-1937, 11 pages.

Nunes et al., AM/AM and AM/PM Distortion Generation Mechanisms in Si LDMOS and GaN HEMT Based RF Power Amplifiers, IEEE Transactions on Microwave Theory and Techniques, vol. 62, No. 4, Apr. 2014, pp. 799-809, 11 pages.

Nunes et al. A Physical Model of Power Amlifiers AM/AM and AM/PM Distortions and Their Internal Relationship, IEEE, Jun. 2-7, 2013, 4 pages.

Rahkonen et al., AM-PM Distortion Caused by Transistor's Signal-Dependent Input Impedance, 20$^{th}$ European Conference on Circuit Theory and Design (ECCTD), IEEE, Aug. 29-31, 2011, pp. 833-836, 4 pages.

Chowdhury et al., A Single-Chip Highly Linear 2.4GHz 30dBm Power Amplifier in 90nm CMOS, IEEE International Solid-State Circuits Conference, Feb. 8-12, 2009, 3 pages.

Aikio et al., A Comprehensive Analysis of AM-AM and AM-PM Conversion in an LDMOS RF Power Amplifier. IEEE Transactions on Microwave Theory and Techniques, vol. 57, No. 2, Feb. 2009, pp. 262-270, 9 pages.

Joglekar et al., "Large Singal Linearity Enhancement of AlGaN/GaN High Electron Mobility Transistors by Device-level $V_T$ Engineering for Transconductance Compensation"; 2017 IEEE International Electron Devices Meeting (IEDM); Dec. 2017; 4 pages.

* cited by examiner

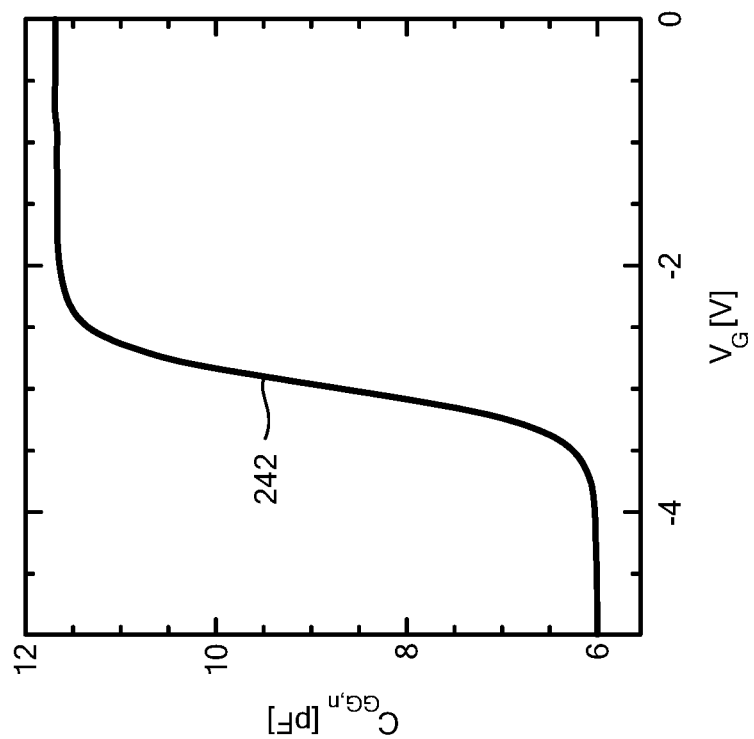
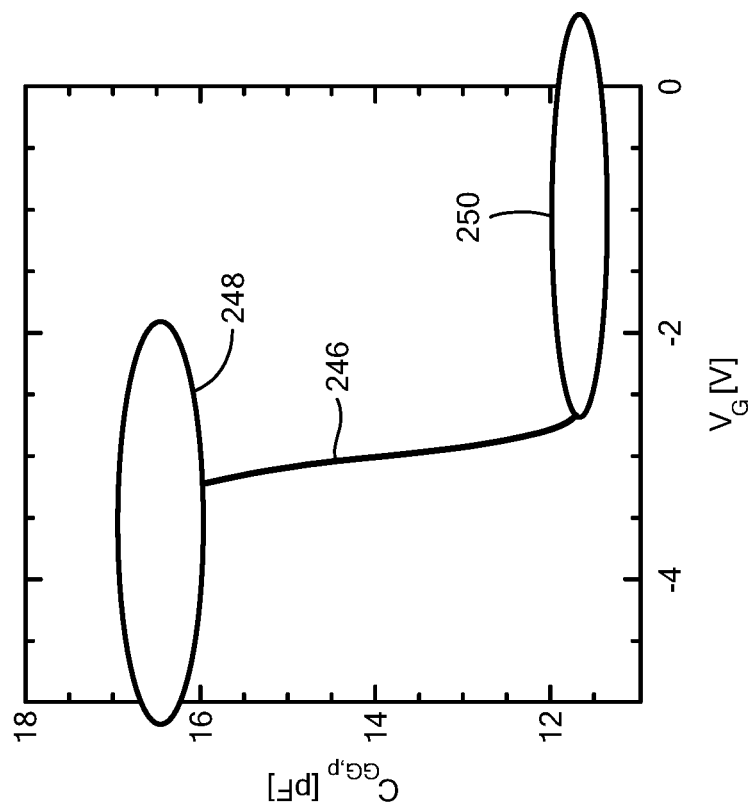
FIG. 2B
FIG. 2A

SEMICONDUCTOR DEVICE WITH LINEAR CAPACITANCE

RELATED APPLICATIONS

This application claims priority to and benefit of U.S. Provisional Patent Application No. 63/019,588 (filed May 4, 2020), which is hereby incorporated herein by reference in its entirety.

FIELD

This disclosure relates to semiconductor devices and, more particularly, to gallium nitride (GaN) transmitter circuits with reduction in spectral regrowth.

BACKGROUND

As is known in the art, spectral regrowth refers to intermodulation products generated in the presence of a digital transmitter added to an analog communication system. As is also known, nonlinearity in a transmitter circuit (and in particular, nonlinearity in a power amplifier of a transmitter circuit) can cause spectral regrowth in a transmit channel. Such spectral regrowth may result in interference with adjacent channels of a transmit circuit (i.e. interference due to so-called out-of-channel spectral regrowth). Such out-of-channel spectral regrowth leads to bit errors in a received signal. Thus, power amplifiers which operate in their linear region may help reduce, and ideally avoid, spectral regrowth and hence out-of-channel interference. Two significant effects responsible for both spectral regrowth in a transmitted signal (and consequently, bit errors in a received signal) are: (1) amplitude-to-amplitude (AM-AM) distortions; and (2) amplitude-to-phase (AM-PM) distortions.

SUMMARY

Radio frequency (RF) power amplifiers (PAs) often comprise one or more field effect transistors (FETs). In some instances, non-linearities in a gate capacitance of a FET in a transmitter circuit can cause or contribute to AM-AM and/or AM-PM distortion. In accordance with the concepts, structures and techniques described herein, it has been recognized that reducing or eliminating non-linearity in a gate capacitance may reduce (and ideally, eliminate) these distortions.

Described herein are concepts, systems, structures and techniques directed towards semiconductor structures and devices and the manufacture thereof which result in RF devices, components and circuits having a high degree of linearity. Additionally, the structures may have gate capacitance with a high degree of linearity. The structures described herein may include one or more of the features independently or in combination with one or more other features described herein below.

In an embodiment, a semiconductor device includes a first component comprising a negatively charged carrier channel; a second component comprising a positively charged carrier channel; and a gate terminal. The gate terminal is electrostatically coupled to the negatively charged carrier channel of the first component and the positively charged carrier channel of the second component.

One or more of the following features may be included.

The first component comprises a drain terminal and a source terminal.

The second component comprises a voltage bias terminal.

The first and second components are positioned adjacent to each other.

The first and second devices are formed on the same substrate.

The negatively charged carrier channel is a 2-DEG carrier channel and the positively charged carrier channel is a 2-DHG carrier channel.

The first component is a three-terminal transistor.

The first component has a capacitance that increases as a voltage at the gate terminal increases and the second component has a capacitance that decreases as the voltage at the gate terminal increases.

The first and second components are vertically stacked.

The negatively charged carrier channel and positively charged carrier channel are on first and second opposing sides of a gate region.

In another embodiment, a semiconductor device includes a first component having a negatively charged carrier channel and having first, second and third terminals; a second component, having a positively charged carrier channel and having first and second terminals. One of the terminals of the first component and the second component is a shared terminal electrically coupled to both the first and second components.

One or more of the following features may be included:

The negatively charged carrier channel of the first component is provided as a two-dimensional electron gas (2-DEG) channel.

The positively charged carrier channel of the first component is provided as a two-dimensional hole gas (2-DHG).

The first, second and third electrodes of the first component correspond to respective ones of source, drain and gate terminals.

First and second electrodes of the second component correspond to respective ones of a gate terminal and a bias-electrode and the gate terminal of first the component is electrically coupled to the gate terminal of the second component.

In another embodiment, a semiconductor device includes a first component comprising first a first material layer on a second material layer forming a junction that creates a negatively charged carrier channel; a second component comprising first material layer on a second material layer forming a second junction that creates a positively charged carrier channel; and a gate terminal. The gate terminal is electrostatically coupled to the negatively charged carrier channel of the first component and the positively charged carrier channel of the second component.

One or more of the following features may be included:

The first material layer of the first component comprises gallium nitride and the second material layer of the first component comprises aluminum gallium nitride.

The first material layer of the second component comprises aluminum gallium nitride and the second material layer of the second component comprises gallium nitride.

The first and second components are vertically stacked.

The negatively charged carrier channel and positively charged carrier channel are on first and second opposing sides of a gate region.

In another embodiment, a semiconductor device includes: (a) an active component comprising: a first narrow-bandgap material layer (material A); and a first wide-bandgap material layer (material B) disposed over material A and having first, second and third electrical connections with the interface between material A and material B corresponding to a negatively charged carrier channel. An auxiliary component includes a second narrow-bandgap material layer (material A); a second wide-bandgap material layer (material B) disposed over the material B with the interface between material A and material B corresponding to a negatively charged carrier channel; a third narrow-bandgap material layer (material C) disposed over the second wide-bandgap material layer (material B) with the interface between the third narrow-bandgap material layer and the second wide-bandgap material layer corresponding to a positively charged carrier channel with a gate terminal disposed on the third narrow-bandgap material layer (material C). The second component also includes a fourth narrow-bandgap material layer (material D) disposed over the third narrow-bandgap material layer (material C); and a bias electrode disposed over fourth narrow-bandgap material layer (material D). The device includes means for electrically connecting the gate terminal of the auxiliary component to a gate terminal of the active component.

One or more of the following features may be included. The means for electrically connecting the gate terminal of the auxiliary component to the gate terminal of the active component comprises providing a gate terminal that is shared by the active component and the auxiliary component.

The gate terminal is electrostatically coupled to the negatively charged carrier channel of the active device and the positively charged carrier channel of the auxiliary device to provide a parasitic capacitance that is relatively linear and constant.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 2A and FIG. 2B are capacitance-voltage (C-V) charts associated with the device of FIG. 2.

DETAILED DESCRIPTION

Figure 1:
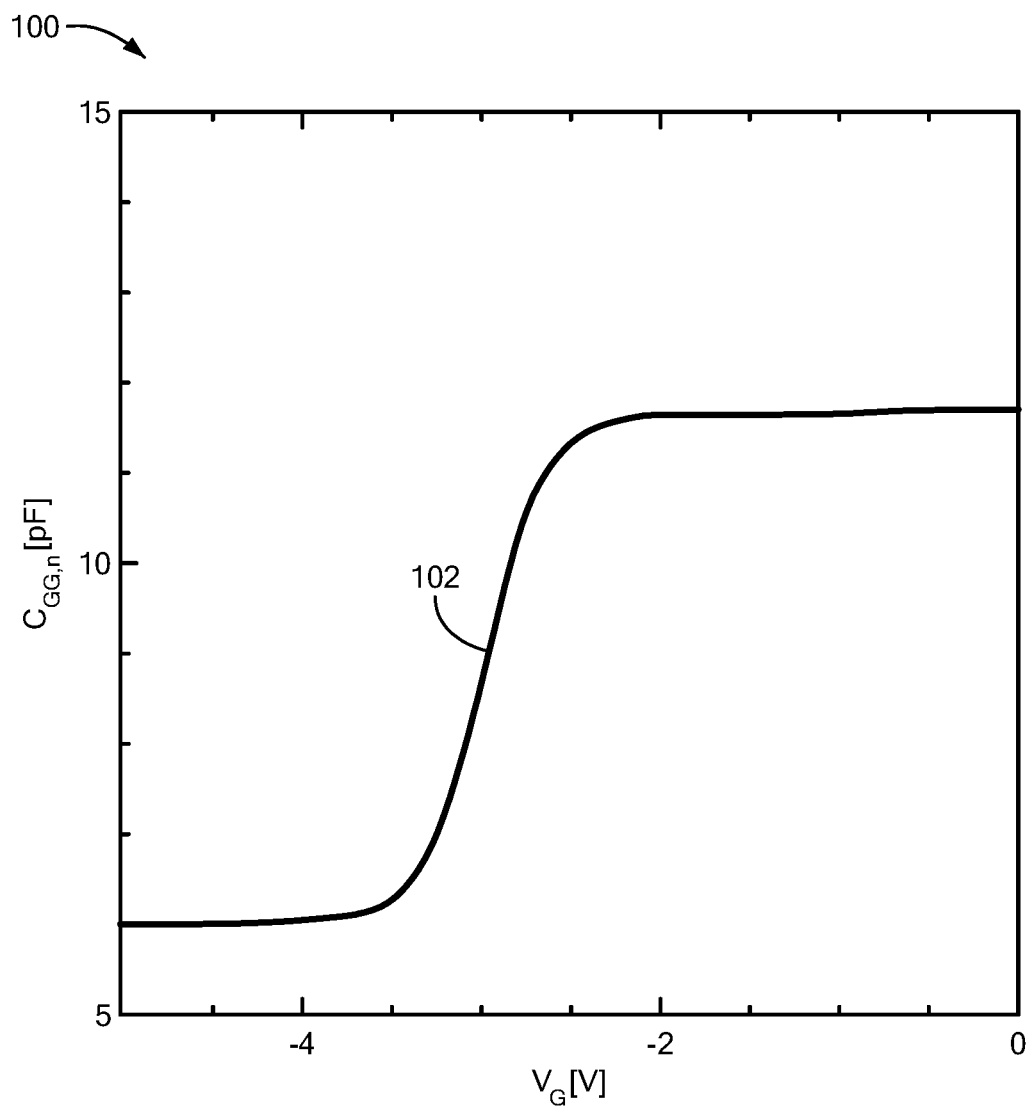
FIG. 1 is a plot of gate capacitance ($C_{GG}$) of a field effect transistor (FET) vs. FET gate voltage ($V_G$)

FIG. 1 illustrates a typical C-V characteristic profile 100 of a field effect transistor (FET) of the prior art that may be used for radio frequency (RF) transmission. The horizontal axis represents applied voltage (i.e. voltage applied to a gate terminal of the FET), and the vertical axis represents parasitic capacitance (i.e parasitic capacitance at the gate terminal of the FET). As can be seen from FIG. 1, a capacitance curve 102 is not linear over the voltage range. In this example, the capacitance jumps from about 6 pF to about 12 pF as the voltage applied to the gate of the FET increases from about −3.5V to about −2V. When the voltage is below −3.5V or above about −2V, capacitance curve 102 is relatively flat (i.e. has a slope of substantially zero).

The non-linearity of a FET, including the non-linearity of the gate capacitance, can contribute to non-linearity of a power amplifier built with the FET. One way to reduce or eliminate the non-linearity is to use a device with a flat (e.g. relatively constant) C-V profile.

In accordance with one aspect of the concepts described herein, one cause of the non-linearity of a C-V curve may be the accumulation/depletion of carriers in a gate channel of a FET. Ideally, accumulation of carriers when a gate voltage $V_G$ approaches a threshold voltage $V_{TH}$ (i.e., at $V_G \sim V_{TH}$) should reduce the non-linearity.

Figure 2:
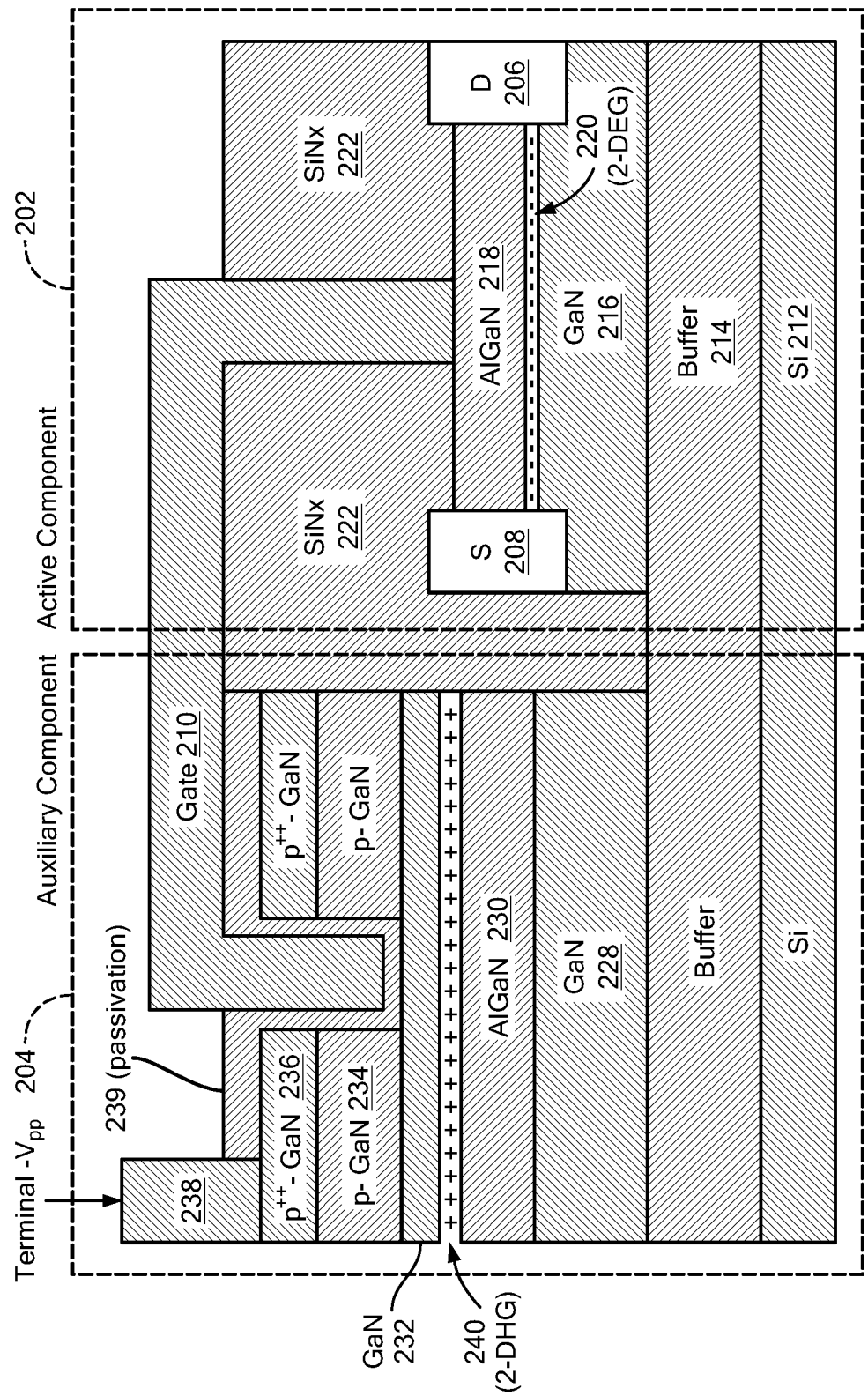
FIG. 2 is a device for achieving higher linearity illustrating the both the active and auxiliary components of the device along with their capacitance-voltage profile.

Referring to FIG. 2, a semiconductor device 200 with improved linearity includes a so-called active component 202 and a so-called auxiliary component 204 positioned adjacent to each other. In other embodiments, active component 202 and the auxiliary component may be stacked on top of each other (i.e. vertically stacked) with either the active component on top of the auxiliary component or vice versa. The device 200 has two carrier channels (a) 2-Dimensional Electron Gas (2-DEG) and (b) 2-dimensional hole gas (2-DHG). And these two carrier channels are being electrostatically controlled by a single gate. This electrostatic control of both positive and negative charge with the same gate terminal leads to constant C(Vgs) profile, as will be discussed below.

The active component 202 may act as a power FET that can be used in a transmitter to amplify a signal for transmission. It includes a drain terminal 206, a source terminal 208, and a gate terminal 210. The active component 202 also includes a semiconductor substrate 212 with a buffer layer 214 positioned on top of the substrate 212. Layer 214 is here a GaN buffer structure, which may also include nucleation and strain relief layers, not shown; typically aluminum nitride (AlN) and aluminum gallium nitride ($Al_xGa_{1-x}N$, where x is 0<x≤1). In this example, an aluminum gallium nitride (AlGaN) layer 218 is positioned on a gallium nitride (GaN) layer 216, which in turn is disposed on the buffer layer 214. The aluminum gallium nitride layer 218 and the gallium nitride layer 216 form a junction 220 e.g. a 2-dimensional electron gas ("2-DEG") channel that is electrostatically controlled by the gate terminal 210. A nitride layer 222, which may be a passivation layer, is disposed on the aluminum gallium nitride layer 218.

The auxiliary component 204 also includes an aluminum gallium nitride layer 230 atop a gallium nitride layer 228. These two layers are positioned on the buffer layer 214 and semiconductor substrate 212. The auxiliary component 204 also includes additional layers: a second gallium nitride layer 232 atop the aluminum gallium nitride layer 230. These two layers 230, 232 form a junction 240 that generates a 2-dimensional hole gas ("2-DHG"), i.e. a local concentration of positively charged holes. Like the 2-DEG junction 220, the 2-DHG junction 240 is also electrostatically controlled by the gate terminal 210. Thus, both junctions 220, 240 are electrostatically controlled by a voltage at the gate.

The auxiliary component also includes a p-doped p-GaN layer 234 positioned on the second GaN layer 232 and p++-GaN layer 236 positioned on the p-GaN layer 234. Layer 234 may have a relatively stronger p-doping than layer 234. The auxiliary component 204 also includes a voltage terminal 238 where a voltage $V_{PP}$ can be applied to the auxiliary component 204.

The active component 202 includes a negatively charged channel (2-DEG channel) which an provides amplification to a signal applied at the gate terminal. This component may have three terminals like a conventional FET, namely source 208, drain 206, and gate 210 terminals. In an RF amplifier application, the load of the amplifier may be connected to the drain terminal in a common source amplifier configuration.

The auxiliary component 204 includes a positively charged channel (2-DHG) has having terminals namely, the gate terminal 210 and a $V_{PP}$ terminal 238. The auxiliary component 204 actus to achieve a constant CGG(VG) profile for the overall input capacitance.

FIGS. 2A and 2B are C-V charts of the auxiliary component 204 and the active component 202, respectively. More specifically, FIG. 2A is the capacitance of the gate terminal 210 on the auxiliary component 204 side of device 200 and FIG. 2B is the capacitance of the gate terminal 210 on the active component 202 side of device 200.

The capacitance profile 242 of the active side 202 is similar to the capacitance profile 102 shown in FIG. 1. However, due to the second GaN layer 232 and the 2-DHG junction 240, the C-V curve 246 is an inverse curve relative to curve 242. In other words, the C-V curve 246 has a relatively high capacitance when the gate voltage is low (e.g. region 248), a relatively low capacitance with the gate voltage is high (e.g. region 250), and a drop in capacitance between the regions 248 and 250. The overall parasitic capacitance of the gate terminal 210 may be the sum of the capacitance of the active component 202 and the capacitance of the auxiliary component 204. In other words, the total capacitance of the gate terminal 210 may be the sum of C-V curve 246 and C-V curve 242. As can be seen, and as will be discussed below, the sum of these two curves produces a relatively flat capacitance response at the gate voltage changes. In this example, the total capacitance response will be relatively flat at least over a rage of about −6V to 0V at the gate terminal 210.

Figure 3:
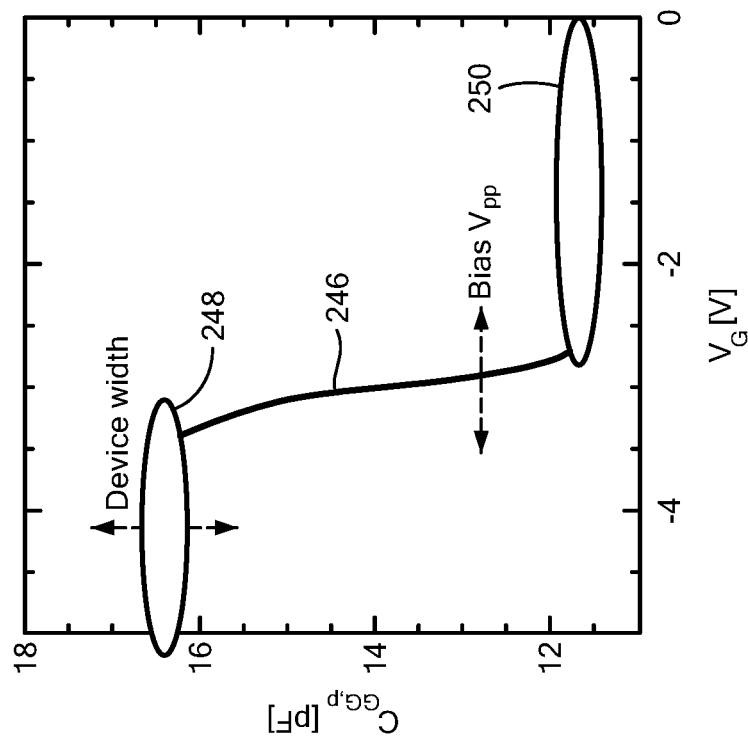
FIG. 3 is a plot illustrating a capacitance-voltage profile of the auxiliary component of the device with 2-DHG illustrating two tuning parameters for matching the capacitance to achieve a constant capacitance profile.

Referring to FIG. 3, the C-V curve 246 of the auxiliary component 204 may be adjusted by changing parameters or characteristics associated with the auxiliary component 204. In particular, the gate capacitance of the auxiliary component 204 in region 248 can be increased or decreased by changing the width of the auxiliary component. Also, the voltage at which the gate capacitance changes from high to low (i.e. the capacitance drop between regions 248 and 25) can be adjusted by changing a bias voltage $V_{PP}$ applied to the terminal 238.

Figure 4:
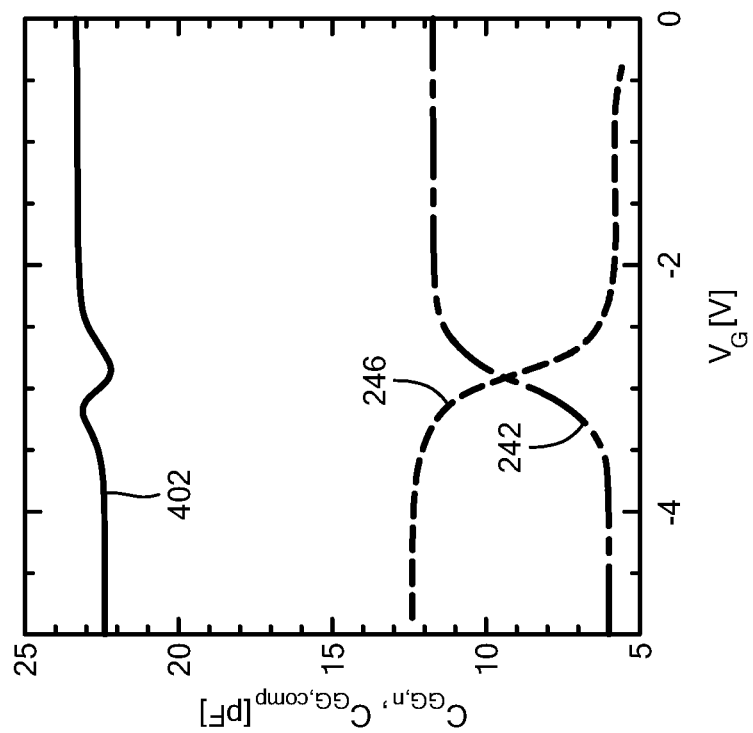
FIG. 4 is a plot illustrating a combined capacitance profile of the auxiliary component and the active component of the device in FIG. 2.

FIG. 4 is a graph showing the C-V curve 246 of the auxiliary component 204 and the C-V curve 242 of the active component 202. Also shown is the C-V curve 402 of the gate terminal 210 of the full device 200, which may be the sum of the C-V curve 242 of the active component 202 and the C-V curve 204 of the auxiliary device. In FIG. 4, the horizontal axis represents gate voltage (i.e. the voltage at gate terminal 210) and the vertical axis represents parasitic gate capacitance.

In embodiments, the absolute value of the combined capacitance 402 of the device 200 may be about twice the capacitance of standard amplifiers. The higher capacitance can result in lower gain in a power amplifier, which may or may not be desirable depending on the application. To reduce the absolute value of the capacitance, the access length (i.e. the distance between the gate terminal 208 and the VPP terminal 238) can be increased.

As illustrated, the C-V curve 402 of the device 200 may be relatively flat, indicating that the device 200 has a relatively linear and constant parasitic gate capacitance across the desired range of gate voltages. The flat capacitance can help to remove or eliminate signal distortion and interference while the voltage at gate terminal 208 switches. As an example, device 200 may be incorporated into a transceiver and used as a power amplifier to amplify a radiofrequency ("RF") signal for transmission via an antenna. In this case, device 200 may produce amplification of the RF signal with less distortion and/or signal interference because of its relatively linear and constant gate capacitance.

Figure 5:
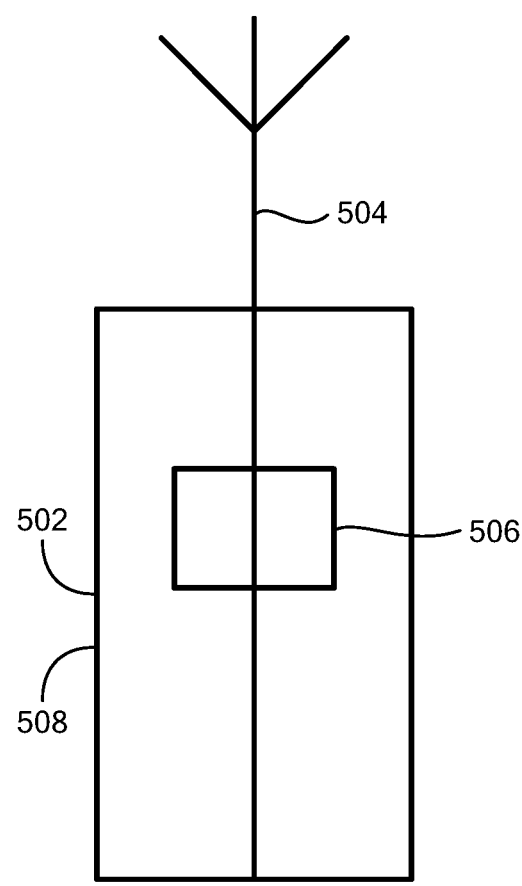
FIG. 5 is a block diagram of a transceiver utilizing the device of FIG. 2.

FIG. 5 illustrates one example of an application in which device 200 can be utilized. In this example, a transceiver 502 includes an antenna 504 for transmitting RF signals. A power amplifier 506 incorporating or consisting of device 200 receives a signal 508, amplifies it, and drives the signal onto antenna 504.

Figure 5B:
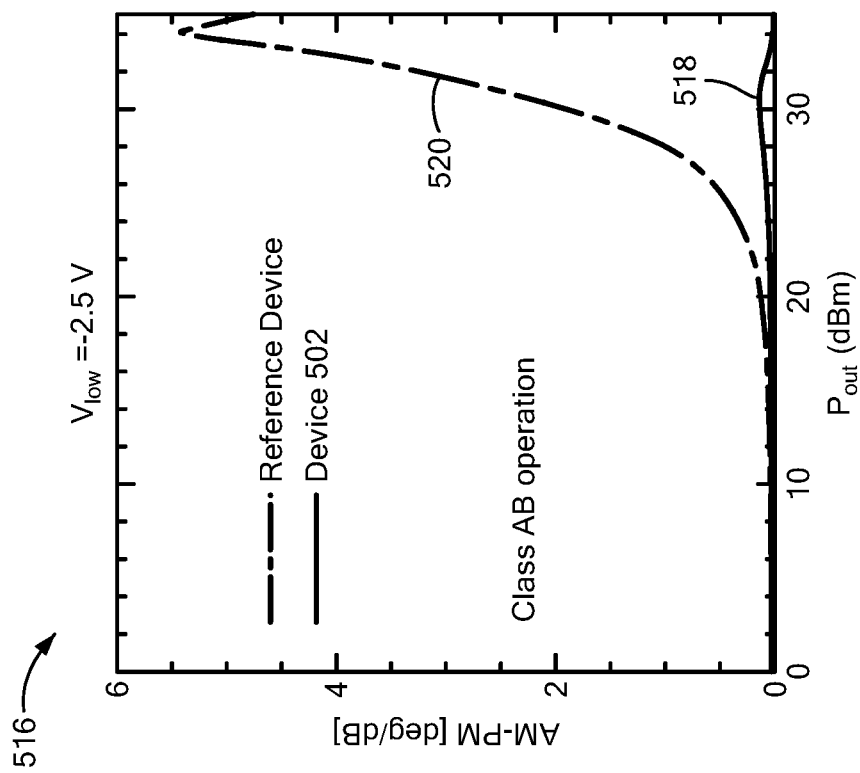
FIGS. 5A and 5B are plots of signal distortion of transceivers showing improved (e.g. reduced) signal distortion associated with the device of FIG. 2.
Figure 5A:
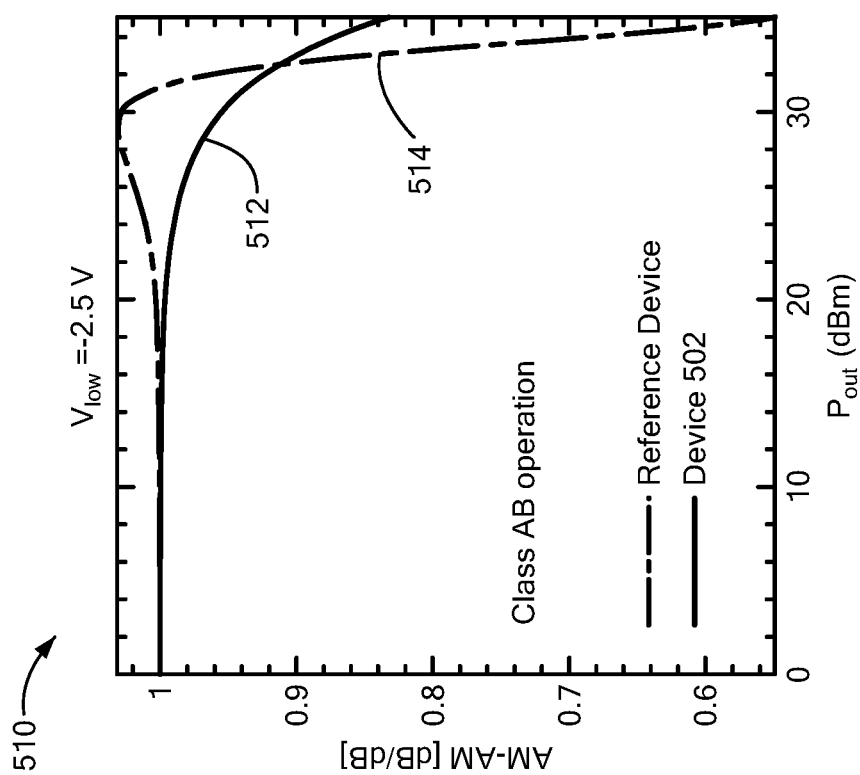

Referring also to FIGS. 5A and 5B, graphs 510 and 516 illustrate the reduced distortion in the output of the transceiver 502, due to utilizing device 200 as a power amplifier to drive an output system to the antenna. Graph 510 is a graph of AM-AM distortion. The horizontal axis represents power output of the transceiver and the vertical axis represents AM-AM distortion. Curve 512 is the AM-AM distortion of the transceiver and curve 514 is the AM-AM distortion of a reference device of the prior art. Unlike the device of the prior art, the distortion from transceiver 502 does not spike or rise above the nominal value of 1 dB per dB.

Graph 516 is a graph of AM-PM distortion. The horizontal axis represents power output of the transceiver and the vertical axis represents AM-AM distortion in degrees of phase per decibel. Curve 518 is the AM-PM distortion of the transceiver 502 and curve 520 is the AM-AM distortion of a reference device of the prior art. Unlike the reference device of the prior art, the AM-PM distortion from transceiver 502 does not spike or rise above the nominal value of about zero degrees of distortion per decibel.

Figure 6:
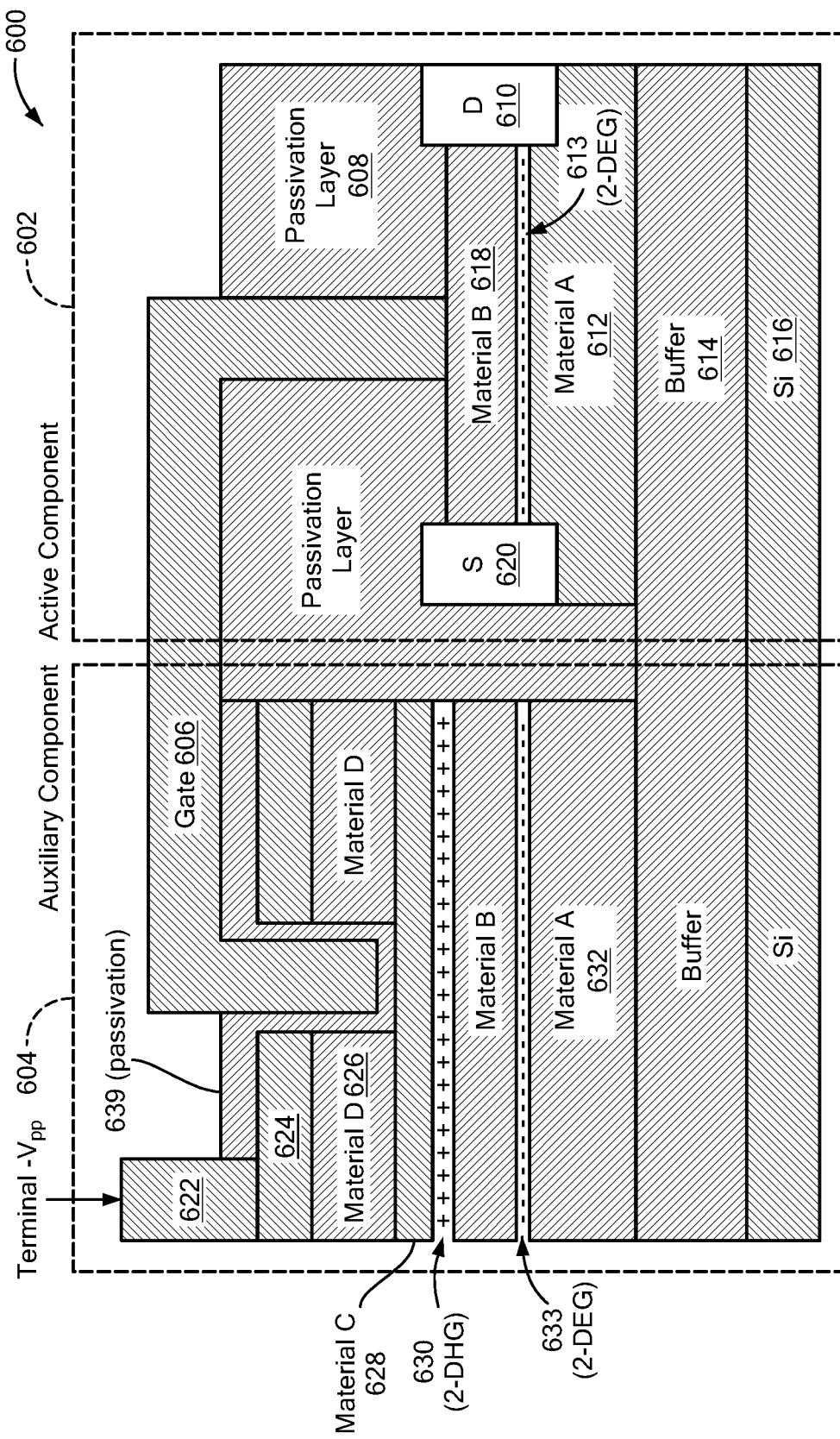
FIG. 6 is a device for achieving higher linearity illustrating the both the active and auxiliary components of the device along with their capacitance-voltage profile.

Referring to FIG. 6, semiconductor device 600 may be the same as or similar to device 200 in FIG. 2. Device 600 may include a first component 602 having a source terminal 620, a drain terminal 610, and a gate terminal 606. Adjacent to the first component 602 is a second component 604 having two terminals: a bias voltage terminal 622 and a gate terminal 606. The gate terminal 606 may be shared by both the first and second components.

In embodiments, the first and second components may be positioned on a common substrate 606 and of buffer layer 614. The first component 602 may include a layer 612 of a first material (which may have a narrow band gap) and a layer 618 of a second material (which may have a wide band gap). These two layers 612 and 618 may form a negatively charged carrier channel 613 between them. The negatively charged carrier channel 613 may be electrostatically coupled to the gate terminal 606. The first component may also include a passivation layer 608.

The semiconductor device 600 may also include a second component 604. The second component 604 may also be positioned on the substrate 616 and buffer layers 614. In embodiments, the second component includes a layer 632 (which may be the same material as layer 612) and a layer 630 (which may be the same material as layer 618). These two layers may also form a negatively charged carrier channel 633. However, adjacent to layer 630, the second component may also have third a layer 628 formed from a third material. The third material may also have a narrow band gap and, in some embodiments, may be the same material as layer 612 and/or layer 632. These layers 638 and 630 may form a positively charged carrier channel 629. In embodiments, the gate terminal 606 may be positioned near the positively charged carrier channel 629 so that the gate terminal 606 and the positively charged carrier channel 629 are electrostatically coupled.

The second component 604 may also include layers 626 and 624 positioned on top of layer 628.

As described above, the parasitic capacitance of the first component may increase non-linearly as the voltage at the gate terminal 606 increases. Also, the parasitic capacitance of the second component may decrease non-linearly as the voltage at the gate terminal 606 increases. These capacitances may be summed together to create an overall capacitance for the device 600. The overall capacitance may be relatively linear and/or relatively constant, as described above in relation to FIG. 4, which may reduce distortion when device 600 is used as an amplifier.

Figure 7:
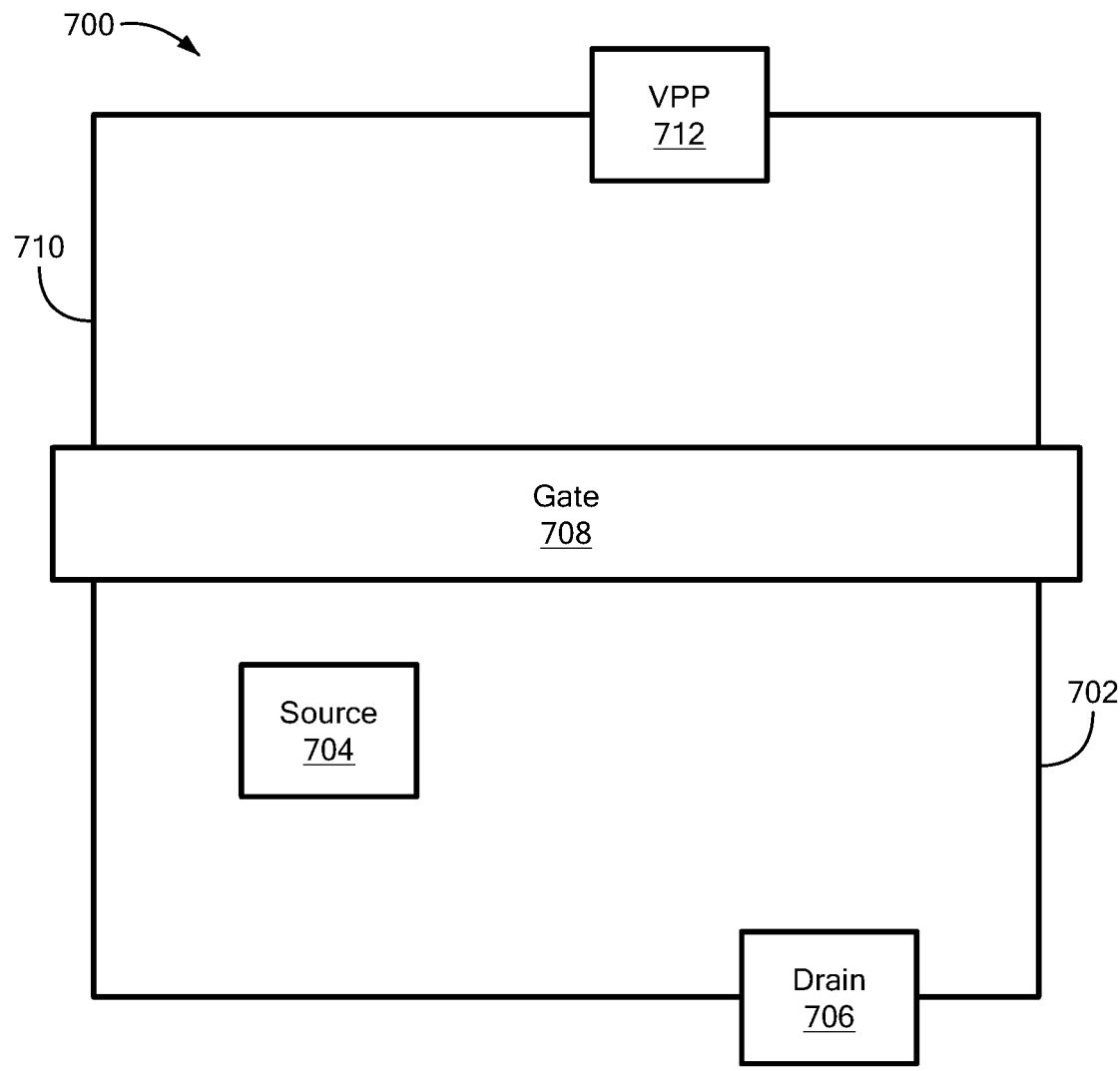
FIG. 7 is a device for achieving higher linearity illustrating the both the active and auxiliary components of the device arranged in a vertical stack.

Referring now to FIG. 7, a semiconductor device 700 may include a three-terminal active component 702 having source 704, drain 706, and gate 708 terminals. Active component 702 may be the same as or similar to active component 202 in FIG. 2. The semiconductor device 700 may also include a two-terminal auxiliary component 710, having a gate terminal 708 and a bias terminal 712. Auxiliary component 710 may be the same as or similar to active component 204 in FIG. 2.

In this embodiment, the active component 702 and auxiliary component 710 may be vertically stacked (i.e. positioned on top of each other). Also, the shared gate terminal 708 may be positioned between the two components 702 and 710 so that the gate terminal 708 can be shared by the two components 702 and 710. In this example, the negatively charged carrier channel of component 702 and the positively charged carrier channel of component 710 may be on opposite sides of the gate terminal 708.

Various embodiments of the concepts, systems, devices, structures, and techniques sought to be protected are described above with reference to the related drawings. Alternative embodiments can be devised without departing from the scope of the concepts, systems, devices, structures, and techniques described. It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e. one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether or not explicitly described.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

The invention claimed is:

1. A semiconductor device comprising:
    an active component comprising:
        a first narrow-bandgap material layer; and
        a first wide-bandgap material layer disposed over the first narrow-bandgap material layer and having first, second and third electrical connections with an interface between the first narrow-bandgap material layer and the first wide-bandgap material layer corresponding to a negatively charged carrier channel with a gate terminal disposed on the first wide-bandgap material layer; and
    an auxiliary component comprising:
        a second narrow-bandgap material layer;
        a second wide-bandgap material layer disposed over the second wide-bandgap material layer with an interface between second narrow-bandgap material layer and second wide-bandgap material layer corresponding to a negatively charged carrier channel;
        a third narrow-bandgap material layer disposed over the second wide-bandgap material layer with an interface between the third narrow-bandgap material layer and the second wide-bandgap material layer corresponding to a positively charged carrier channel with a gate terminal disposed on the third narrow-bandgap material layer; and
        a fourth narrow-bandgap material layer disposed over the third narrow-bandgap material layer; and
        a bias electrode disposed over fourth narrow-bandgap material layer; and
    means for electrically connecting the gate terminal of the auxiliary component to the gate terminal of the active component.

2. The semiconductor device of claim 1 wherein the gate terminal is electrostatically coupled to the negatively charged carrier channel of the active component and the positively charged carrier channel of the auxiliary component to provide a parasitic capacitance that is relatively linear and constant.

3. The semiconductor device of claim 2 wherein the means for electrically connecting the gate terminal of the auxiliary component to the gate terminal of the active component comprises a gate terminal that is shared by the active component and the auxiliary component.

4. The semiconductor device of claim 1 wherein the active component and the auxiliary component are positioned adjacent to each other.

5. The semiconductor device of claim 1 wherein the active component and the auxiliary component are formed on a substrate.

6. The semiconductor device of claim 1 wherein the negatively charged carrier channel is a two-dimensional electron gas ("2-DEG") carrier channel and the positively charged carrier channel is a two-dimensional hole gas ("2-DHG") carrier channel.

7. The semiconductor device of claim 1 wherein the first narrow-bandgap material layer of the active component comprises gallium nitride and the first wide-bandgap material layer of the active component comprises aluminum gallium nitride.

8. The semiconductor device of claim 1 wherein the second narrow-bandgap material layer of the auxiliary component comprises aluminum gallium nitride and the second wide-bandgap material layer of the auxiliary component comprises gallium nitride.

9. The semiconductor device of claim 1 wherein the first and second electrical connections of the active component correspond to respective ones of a drain terminal and a source terminal and third electrical connections of the active component corresponds to the gate terminal.

10. The semiconductor device of claim 1 wherein the active component is a three-terminal transistor.

11. The semiconductor device of claim 3 wherein the active component has a capacitance that increases in response to a voltage at the gate terminal increasing and the auxiliary component has a capacitance that decreases in response to a voltage at the gate terminal increasing.

12. A semiconductor device comprising:
    an active component comprising:
        a first narrow-bandgap material layer; and
        a first wide-bandgap material layer disposed over the first narrow-bandgap material layer and having first, second and third electrical connections with an interface between the first narrow-bandgap material layer and the first wide-bandgap material layer corresponding to a negatively charged carrier channel with a gate terminal disposed on the first wide-bandgap material layer; and
    an auxiliary component comprising:
        a second narrow-bandgap material layer;
        a second wide-bandgap material layer disposed over the second wide-bandgap material layer with an interface between second narrow-bandgap material layer and second wide-bandgap material layer corresponding to a negatively charged carrier channel;
        a third narrow-bandgap material layer disposed over the second wide-bandgap material layer with an interface between the third narrow-bandgap material layer and the second wide-bandgap material layer corresponding to a positively charged carrier channel with a gate terminal disposed on the third narrow-bandgap material layer; and a fourth narrow-bandgap material layer disposed over the third narrow-bandgap material layer; and a bias electrode disposed over fourth narrow-bandgap material layer; and wherein the gate terminal of the active component and the gate terminal of the auxiliary component are a shared gate terminal.

13. The semiconductor device of claim 12 wherein the shared gate terminal is electrostatically coupled to the negatively charged carrier channel of the active component and the positively charged carrier channel of the auxiliary component to provide a parasitic capacitance that is relatively linear and constant.

14. The semiconductor device of claim 12 wherein the active component and the auxiliary component are positioned adjacent to each other.

15. The semiconductor device of claim 12 wherein the active component and the auxiliary component are formed on a substrate.

16. The semiconductor device of claim 12 wherein the negatively charged carrier channel is a two-dimensional electron gas ("2-DEG") carrier channel and the positively charged carrier channel is a two-dimensional hole gas ("2-DHG") carrier channel.

17. The semiconductor device of claim 12 wherein the first narrow-bandgap material layer of the active component comprises gallium nitride and the first wide-bandgap material layer of the active component comprises aluminum gallium nitride.

18. The semiconductor device of claim 12 wherein the second narrow-bandgap material layer of the auxiliary component comprises aluminum gallium nitride and the second wide-bandgap material layer of the auxiliary component comprises gallium nitride.

19. The semiconductor device of claim 12 wherein the negatively charged carrier channel and positively charged carrier channel are on first and second opposing sides of the shared gate terminal.

* * * * *